United States Patent
Adachi et al.

(10) Patent No.: US 12,040,039 B2
(45) Date of Patent: Jul. 16, 2024

(54) SEMICONDUCTOR DEVICE HAVING SYNDROME GENERATOR

(71) Applicant: MICRON TECHNOLOGY, INC., Boise, ID (US)

(72) Inventors: Kenya Adachi, Tokyo (JP); Takuya Nakanishi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/821,252

(22) Filed: Aug. 22, 2022

(65) Prior Publication Data
US 2024/0062843 A1    Feb. 22, 2024

(51) Int. Cl.
*G11C 29/56* (2006.01)
*H03M 13/00* (2006.01)
*H03M 13/15* (2006.01)

(52) U.S. Cl.
CPC .... *G11C 29/56008* (2013.01); *H03M 13/1575* (2013.01); *H03M 13/611* (2013.01)

(58) Field of Classification Search
CPC ....... G11C 19/56008; G11C 29/56008; H03M 13/1575; H03M 13/611
USPC ........................................................ 714/723
See application file for complete search history.

(56) References Cited

U.S. PATENT DOCUMENTS

| | | | | |
|---|---|---|---|---|
| 4,710,934 A * | 12/1987 | Traynor | ............ | G06F 11/1008 714/766 |
| 7,454,662 B2 * | 11/2008 | Hartmann | ............ | G11C 29/40 714/42 |
| 8,689,065 B2 * | 4/2014 | Park | ............ | G11C 29/40 714/723 |
| 9,214,965 B2 * | 12/2015 | Fitzpatrick | ............ | G06F 11/1012 |
| 2011/0029807 A1 * | 2/2011 | Fry | ............ | G06F 11/106 714/E11.159 |
| 2014/0068154 A1 * | 3/2014 | Hoya | ............ | G11C 8/18 711/105 |
| 2022/0059178 A1 * | 2/2022 | Moon | ............ | G11C 7/106 |
| 2023/0170039 A1 * | 6/2023 | Best | ............ | G11C 29/022 714/4.3 |

FOREIGN PATENT DOCUMENTS

EP    3780397 A1 *    2/2021    ......... G06F 11/1012

* cited by examiner

Primary Examiner — Shelly A Chase
Assistant Examiner — Enam Ahmed
(74) Attorney, Agent, or Firm — Dorsey & Whitney LLP

(57) ABSTRACT

An apparatus that includes a memory cell array, an I/O terminal supplied with an original write data in a normal operation, a compression logic circuit configured to generate a compressed test data in a test operation based on a test read data read from the memory cell array, and a syndrome generator configured to generate a first syndrome based on the original write data in the normal operation and generate a second syndrome based on the compressed test data in the test operation.

20 Claims, 9 Drawing Sheets

SEMICONDUCTOR DEVICE HAVING SYNDROME GENERATOR

BACKGROUND

In a manufacturing process of a semiconductor memory device such as a DRAM (Dynamic Random Access Memory), there is a case where an operation test is performed to determine whether each address is normally accessible. In the operation test, a test read data is compressed inside the semiconductor memory device to reduce the testing time. However, when a dedicated bus or processing circuit is provided to transfer a fail data generated by compression of the test read data, the chip size becomes larger.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
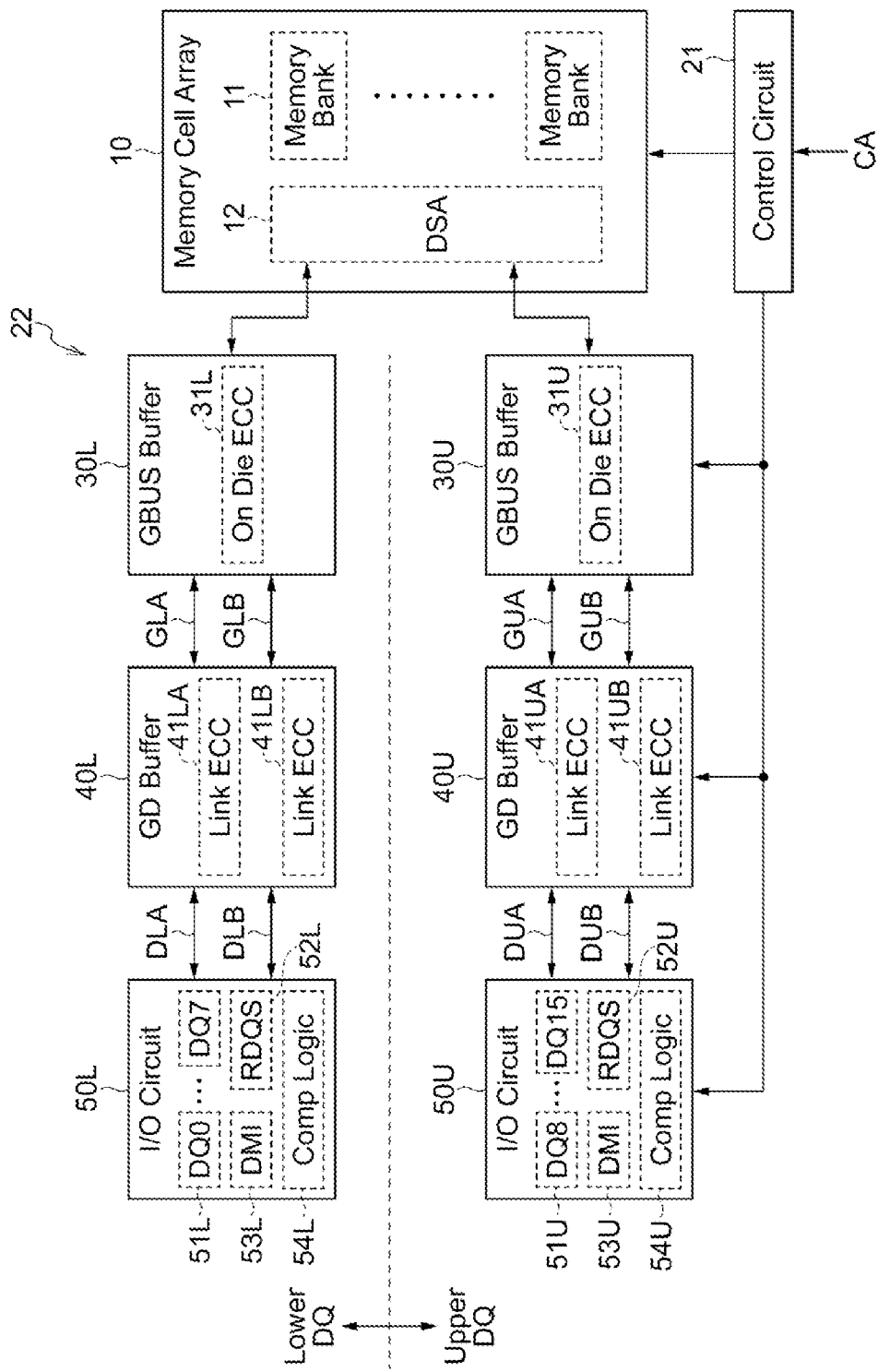
FIG. 1 is a block diagram showing a configuration of a semiconductor memory device according to an embodiment of the present disclosure.

FIG. 1 is a block diagram showing a configuration of a semiconductor memory device according to an embodiment of the present disclosure. The semiconductor memory device shown in FIG. 1 is a DRAM, for example, and includes a memory cell array 10, a control circuit 21 that accesses the memory cell array 10, and a data transfer circuit 22 that transfers data. The memory cell array 10 includes a plurality of memory banks 11 and a data sense amplifier 12. The memory banks 11 are grouped into at least two bank groups. When a command address signal CA is input from outside, the control circuit 21 performs a read operation or a write operation for a memory cell included in any of the memory banks 11. In the read operation, a read data read from a selected one of the memory banks 11 is output to the data transfer circuit 22 via the data sense amplifier 12. The data transfer circuit 22 is divided into a Lower DQ side circuit and an Upper DQ side circuit. Data I/O terminals 51L that perform inputting and outputting data DQ0 to DQ7 are assigned to the Lower DQ side circuit. Data I/O terminals 51U that perform inputting and outputting data DQ8 to DQ15 are assigned to the Upper DQ side circuit. In one read operation or one write operation, the Lower DQ side circuit and the Upper DQ side circuit are operated at the same time. An I/O circuit SOL including the data I/O terminal 51L further includes a parity terminal 52L to which a write parity RDQS is input, a data mask terminal 53L to which a data mask signal DMI is input, and a compression logic circuit 54L that compresses a test read data. Similarly, an I/O circuit 50U including the data I/O terminal 51U further includes a party terminal 52U to which the write party RDQS is input, a data mask terminal 53U to which the data mask signal DMI is input, and a compression logic circuit 54U that compresses the test read data.

A GBUS buffer circuit 30L and a GD buffer circuit 40L are provided between the memory cell array 10 and the I/O circuit 50L. Similarly, a GBUS buffer circuit 30U and a GD buffer circuit 40U are provided between the memory cell array 10 and the I/O circuit 50U. The GBUS buffer circuit 30L and the GD buffer circuit 40L are connected to each other via two systems of global I/O lines GLA and GLB, and the GD buffer circuit 40L and the I/O circuit SOL are connected to each other via two systems of data I/O lines DLA and DLB. Similarly, the GBUS buffer circuit 30U and the GD buffer circuit 40U are connected to each other via two systems of global I/O lines GUA and GUB, and the GD buffer circuit 40U and the I/O circuit 50U are connected to each other via two systems of data I/O lines DUA and DUB. When access to the memory bank 11 in a certain bank group is requested, data transfer is performed using one of the two systems of lines (for example, the system of lines on the side A). Thereafter, when access to the memory bank 11 in another bank group is requested, data transfer is performed using the other system of lines (for example, the system of lines on the side B). The operation of the data transfer circuit 22 is controlled by the control circuit 21.

The GBUS buffer circuits 30L and 30U include ECC circuits 31L and 31U, respectively. In a read operation, when a read data read from the memory cell array 10 includes an error, the ECC circuits 31L and 31U correct the error. Accordingly, a correct read data, that is, an error-corrected read data is transferred to the GD buffer circuits 40L and 40U via the global I/O lines GLA and GUA or the global I/O lines GLB and GUB. The read data transferred to the GD buffer circuits 40L and 40U is transferred to the I/O circuits 50L and 50U via the data I/O lines DLA and DUA or the data I/O lines DLB and DUB, and read data DQ0 to DQ15 are burst-output from the data I/O terminals 51L and MU.

Meanwhile, in a write operation, write data DQ0 to DQ15 are burst-input to the data I/O terminals 51L and 51U, and the write parity RDQS is burst-input to the parity terminals 52L and 52U. The I/O circuits 50L and 50U transfer the write data and the write parity to the GD buffer circuits 40L and 40U via the data I/O lines DLA and DUA or the data I/O lines DLB and DUB. The GD buffer circuit 40L includes ECC circuits 41LA and 41LB, and the GD buffer circuit 40U includes ECC circuits 41UA and 41UB. The write data and the write parity are input to the ECC circuits 41LA, 41LB, 41UA, and 41UB via the data I/O lines DLA, DLB, DUA, and DUB, respectively. The ECC circuits 41LA, 41LB, 41UA, and 41UB each generate a syndrome by using the write data and the write parity and correct an error included in the write data based on the syndrome.

Figure 2:
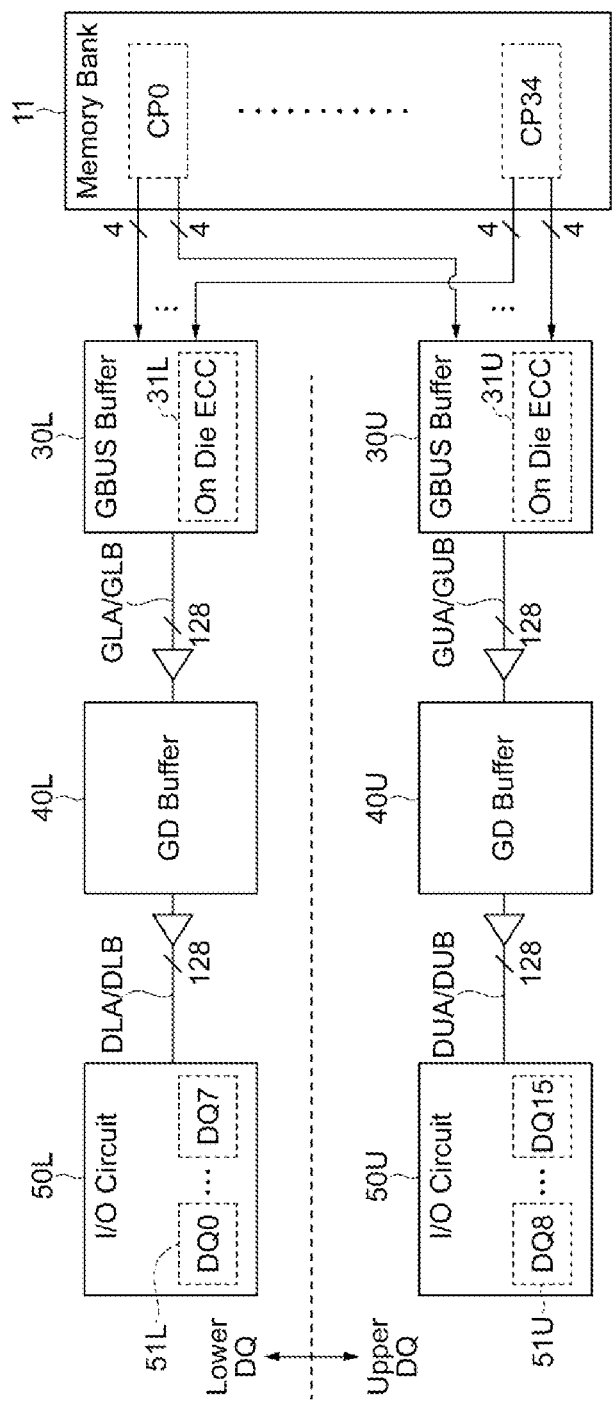
FIG. 2 is a block diagram for explaining a flow of a read data in a read operation.

FIG. 2 is a block diagram for explaining a data flow in a read operation. As shown in FIG. 2, one memory bank 11 includes 35 column planes CP0 to CP34. In the read operation, an 8-bit read data is output from each of the column planes CP0 to CP34 in a selected memory bank 11 in parallel. When there is no defective column address, a user data is retained in 32 column planes CP0 to CP31 among the column planes CP0 to CP34. The remaining column planes CP32 to CP34 are used for retaining a parity and as a spare in a case where there is a defective column address. A data read from each of the column planes CP0 to CP34 is an 8-bit data. In the 8-bit data, four bits corresponding to Lower DQ are supplied to the GBUS buffer circuit 30L, and four bits corresponding to Upper DQ are supplied to the GBUS buffer circuit 30U. The GBUS buffer circuits 30L and 30U correct an error included in the read data by using the ECC circuits 31L and 31U. The error-corrected read data is a 128-bit data on both the Lower DQ side and the Upper DQ side. In the read operation, the global I/O lines GLA and GUA or GLB and GUB and the data I/O lines DLA and DUA or DLB and DUB enter a read mode. Accordingly, a total of 256 bits of read data is transferred from the GBUS buffer circuits 30L and 30U to the GD buffer circuits 40L and 40U via the global I/O lines GLA and GUA or GLB and GUB, and is further transferred from the GD buffer circuits 40L and 40U to the I/O circuits 50L and 50U via the data I/O lines DLA and DUA or DLB and DUB. The 256-bit read data DQ0 to DQ15 is then burst-output to outside via the 16 data I/O terminals 51L and 51U.

Figure 3:
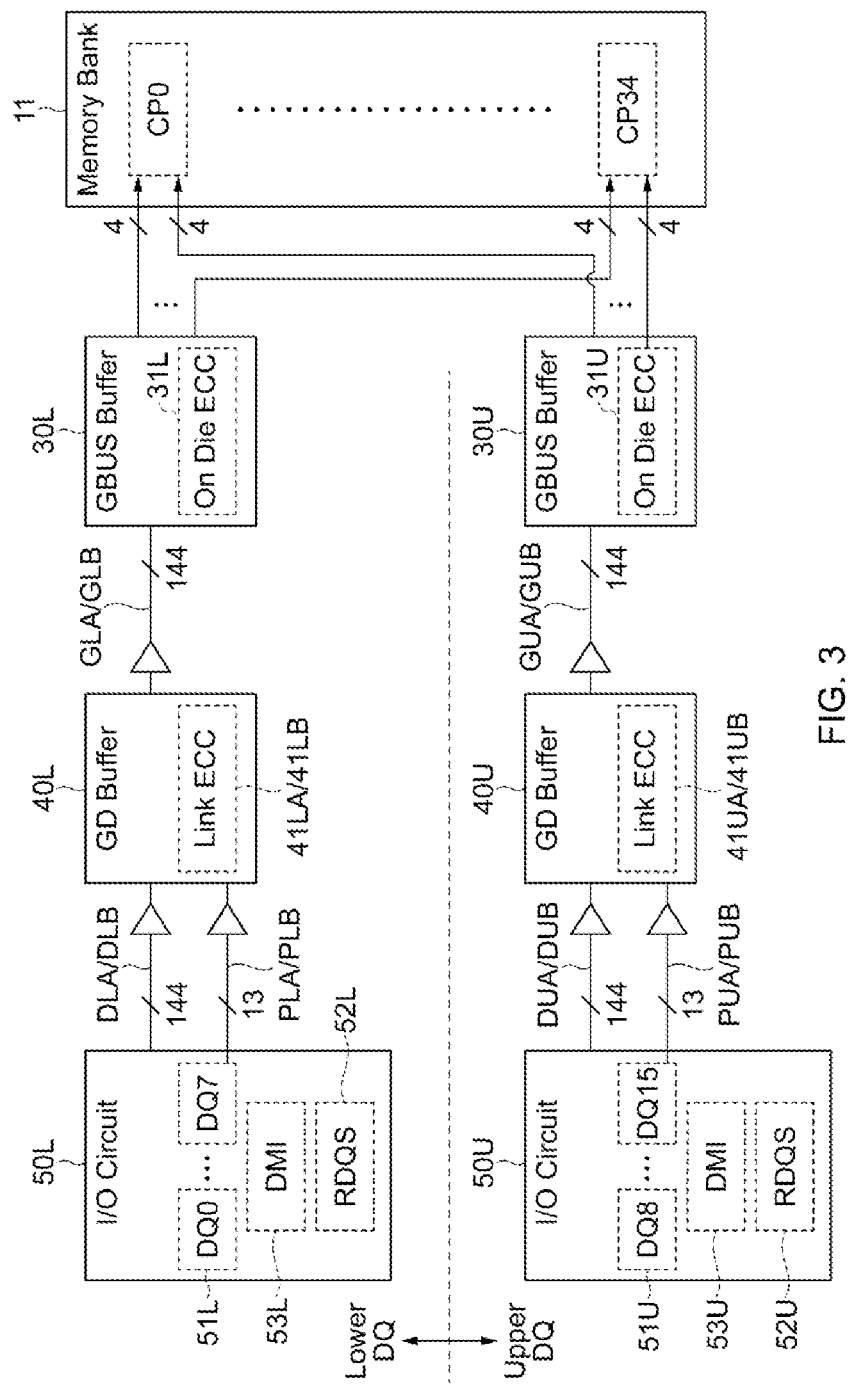
FIG. 3 is a block diagram for explaining a flow of a write data in a write operation.

FIG. 3 is a block diagram for explaining a data flow in a write operation. In the write operation, a total of 256 bits of write data DQ0 to DQ15 is burst-input to the 16 data I/O terminals 51L and 51U. Also, the 13-bit write parity RDQS is burst-input to each of the parity terminals 52L and 52U, and the 16-bit data mask signal DMI is burst-input to each of the data mask terminals 53L and 53U. The write data DQ0 to DQ15 and the data mask signal DMI are transferred to the GD buffer circuits 40L and 40U via the data I/O lines DLA and DUA or DLB and DUB. The write parity RDQS is transferred to the GD buffer circuits 40L and 40U via bus lines for parity PLA and PUA or PLB and PUB. The write data DQ0 to DQ15, the data mask signal DMI, and the write parity RDQS transferred to the GD buffer circuits 40L and 40U are input to the ECC circuits 41LA and 41UA or 41LB and 41UB.

Figure 4:
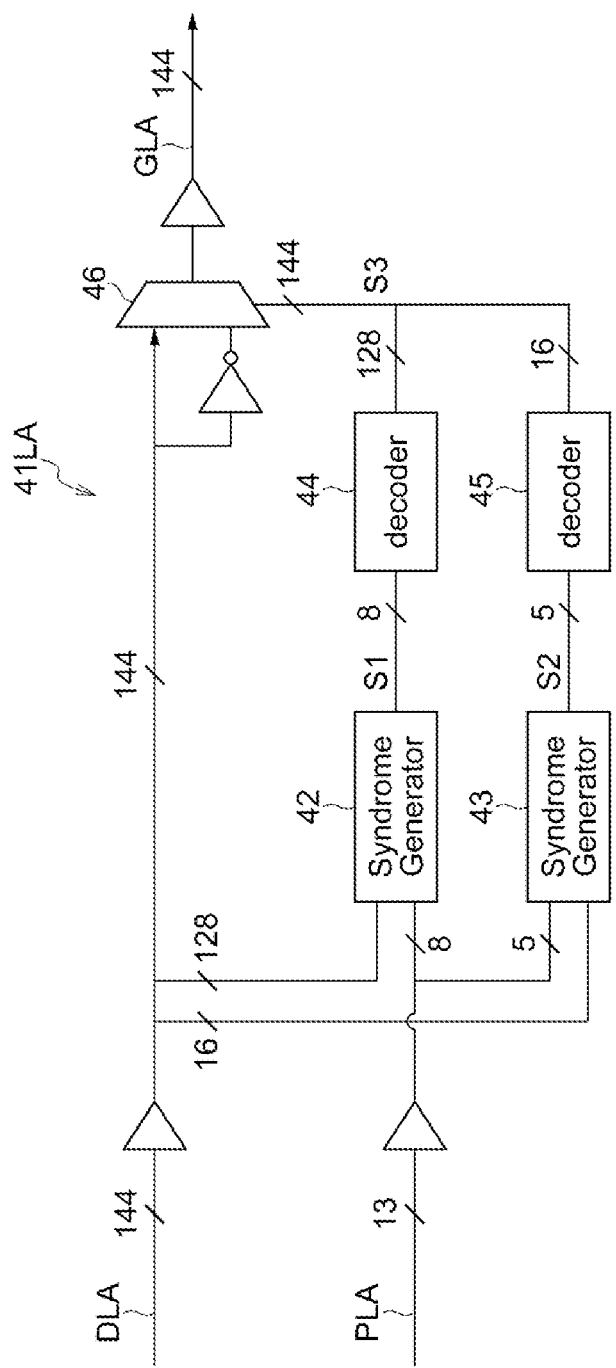
FIG. 4 is a circuit diagram of an ECC circuit.

As shown in FIG. 4, the ECC circuit 41LA includes syndrome generators 42 and 43 that generate a syndrome, decoders 44 and 45, and a multiplexer 46. The syndrome generator 42 generates an 8-bit syndrome S1 based on a 128-bit write data and an 8-bit write parity. The syndrome generator 43 generates a 5-bit syndrome S2 based on a 16-bit data mask signal and a 5-bit write parity. The syndrome S1 is used for a write data, and the syndrome S2 is used for data masking. The syndromes S1 and S2 are decoded by the decoders 44 and 45, respectively, so that a total of 144 bits of error correction signal S3 is generated. The error correction signal S3 indicates, when a 144-bit signal supplied via the data I/O line DLA includes an error bit, the position of that error bit. For example, 0 is assigned to an error-free bit and 1 is assigned to an error bit. The error correction signal S3 is supplied to the multiplexer 46. The multiplexer 46 corrects the error of the 144-bit signal supplied via the data I/O line DLA based on the error correction signal S3. The corrected 144-bit signal is supplied to the global I/O line GLA. The other ECC circuits 41UA, 41LB, and 41UB also have an identical circuit configuration. In this manner, an error-corrected write data is supplied to the global I/O lines GLA and GUA or GLB and GUB. The GBUS buffer circuits 30L and 30U generate a parity by using the ECC circuits 31L and 31U, and supply the write data and the parity to corresponding column planes CP0 to CP34. As described above, in the write operation, the global I/O lines GLA and GUA or GLB and GUB and the data I/O lines DLA and DUA or DLB and DUB enter a write mode.

Figure 5:
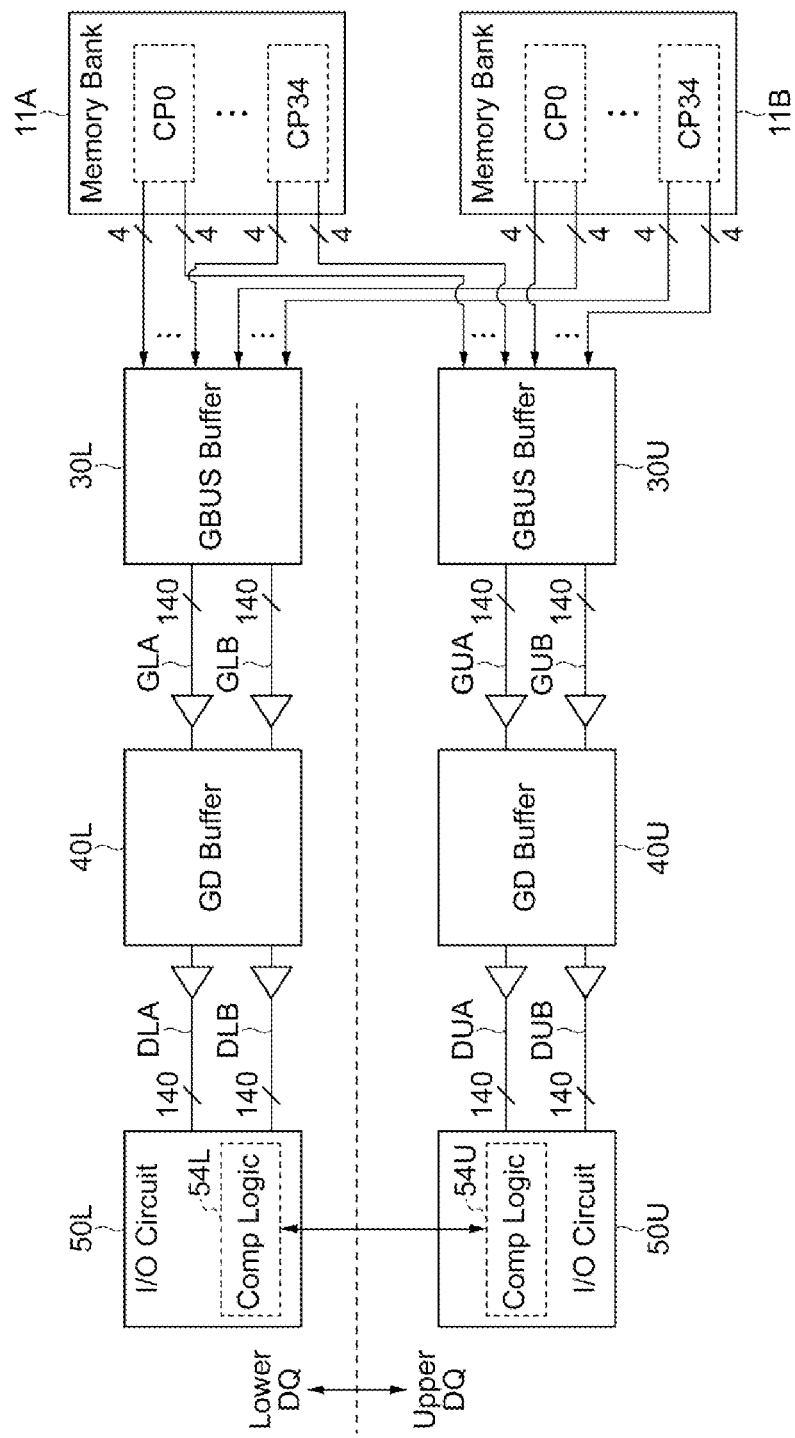
FIG. 5 is a block diagram for explaining a flow of a test read data in a test operation.

FIG. 5 is a block diagram for explaining a data flow in a test operation. As shown in FIG. 5, two memory banks 11A and 11B are simultaneously selected in the test operation. The two memory banks 11A and 11B selected simultaneously belong to bank groups different from each other. Accordingly, an 8-bit test read data is output from each of the column planes CP0 to CP34 in the selected two memory banks 11A and 11B in parallel. Expected values of the 8-bit test read data output from each of the column planes CP0 to CP34 are all 0 or all 1. In the data read from the memory banks 11A and 11B, four bits corresponding to Lower DQ are supplied to the GBUS buffer circuit 30L, and four bits corresponding to Upper DQ are supplied to the GBUS buffer circuit 30U. In the test operation, error correction is not performed in the GBUS buffer circuits 30L and 30U, and a 280-bit test read data read from each of the memory banks 11A and 11B is transferred to the GD buffer circuits 40U and 40L as it is. In the test operation, both the global I/O lines GLA and GUA and the global I/O lines GLB and GUB are used. For example, in the test read data read from the memory bank 11A, a 140-bit test read data corresponding to Lower DQ is transferred by using the global I/O line GLA, and a 140-bit test read data corresponding to Upper DQ is transferred by using the global I/O line GUA. Further, in the test read data read from the memory bank 11B, a 140-bit test read data corresponding to Lower DQ is transferred by using the global I/O line GLB, and a 140-bit test read data corresponding to Upper DQ is transferred by using the global I/O line GUB.

Figure 6:
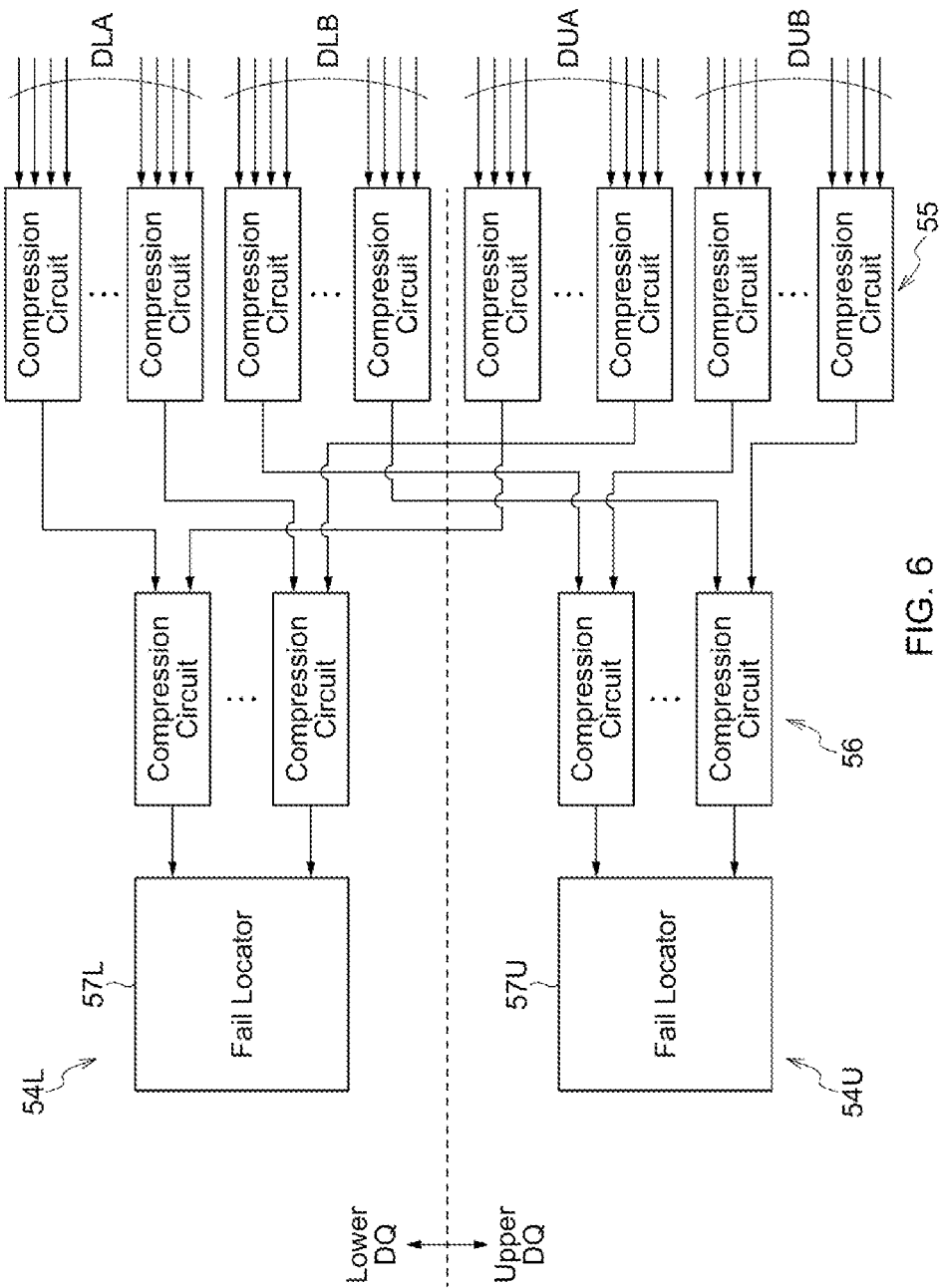
FIG. 6 is a circuit diagram of a compression logic circuit.

The GD buffer circuit 40L supplies the 140-bit test read data supplied via each of the global I/O lines GLA and GLB to the I/O circuit 50L via the corresponding data I/O line DLA or DLB. Similarly, the GD buffer circuit 40U supplies the 140-bit test read data supplied via each of the global I/O lines GUA and GUB to the I/O circuit 50U via the corresponding data I/O line DUA or DUB. As described above, when the test read data is supplied to the I/O circuits 50L and 50U, the data I/O lines DLA, DUA, DLB, and DUB enter a read mode. The test read data supplied to the I/O circuits 50L and 50U is input to the compression logic circuits ML and MU. As shown in FIG. 6, the compression logic circuits ML and MU include compression circuits 55 and 56 that compress a test read data on the data I/O lines DLA, DLB, DUA, and DUB in two stages, and fail locators 57L and 57U. The compression circuits 55 compare a 4-bit test read data read from the same column plane in the test read data on the data I/O lines DLA, DLB, DUA, and DUB, and determines whether they match each other. The compression circuit 56 compares output signals in output signals of the compression circuits 55, which are from the comparison circuits 55 comparing a data read out from the same column plane, with each other and determines whether they match each other. With these operations, it is determined whether an 8-bit test read data read from one column plane is all 0 or all 1. The result of determination is input to the fail locators 57L and 57U. A fail data indicating the determination result of a test read data read out from the memory bank 11A is input to the fail locator 57L, while a fail data indicating the determination result of a test read data read out from the memory bank 11B is input to the fail locator 57U.

Figure 7:
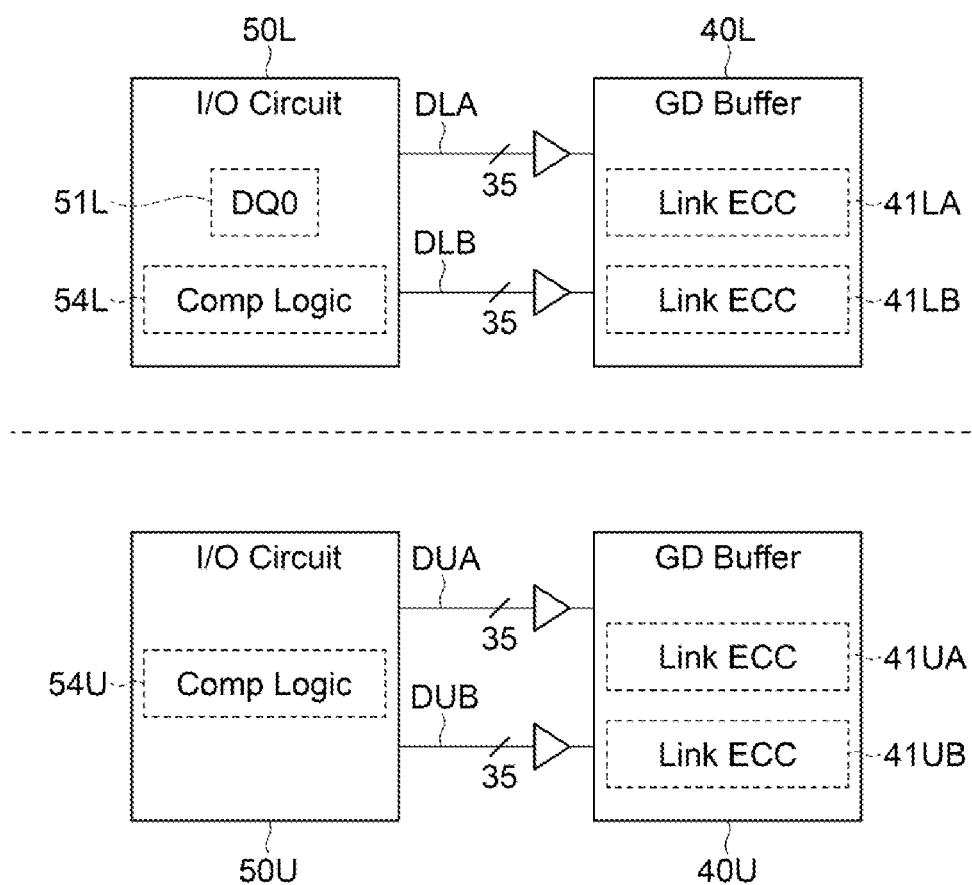
FIG. 7 and FIG. 8 are block diagrams for explaining a flow of a determination data in a test operation.

As shown in FIG. 7, the fail data generated by the compression logic circuits ML and MU is fed back to the GD buffer circuits 40L and 40U via the data I/O lines DLA, DLB, DUA, and DUB. In the example shown in FIG. 7, a fail data indicating a defective column plane among 35 column planes included in the memory bank 11A is supplied to the GD buffer circuit 40L via the data I/O lines DLA and DLB, and a fail data indicating a defective column plane among 35 column planes included in the memory bank 11B is supplied to the GD buffer circuit 40U via the data I/O lines DUA and DUB. As described above, when a determination data is supplied to the data I/O circuits 40L and 40U, the data I/O lines DLA, DUA, DLB, and DUB enter a write mode. Further, since transfer of a fail data uses both the data I/O lines DLA and DLB and uses both the data I/O lines DUA and DUB, a maximum of two pieces of information each related to a defective column plane per one memory bank can be transferred. Among the 35 column planes included in the memory bank 11A, for example, a fail data related to the first defective column plane is transferred via the data I/O line DLA, and a fail data related to the second defective column plane is transferred via the data I/O line DLB. Similarly, among the 35 column planes included in the memory bank 11B, a fail data related to the first defective column plane is transferred via the data I/O line DUA, and a fail data related to the second defective column plane is transferred via the data I/O line DUB. Both of these fail data have a 35-bit configuration, for example, in which only a bit corresponding to a defective column plane is 1 and the remaining bits are all 0.

Figure 8:
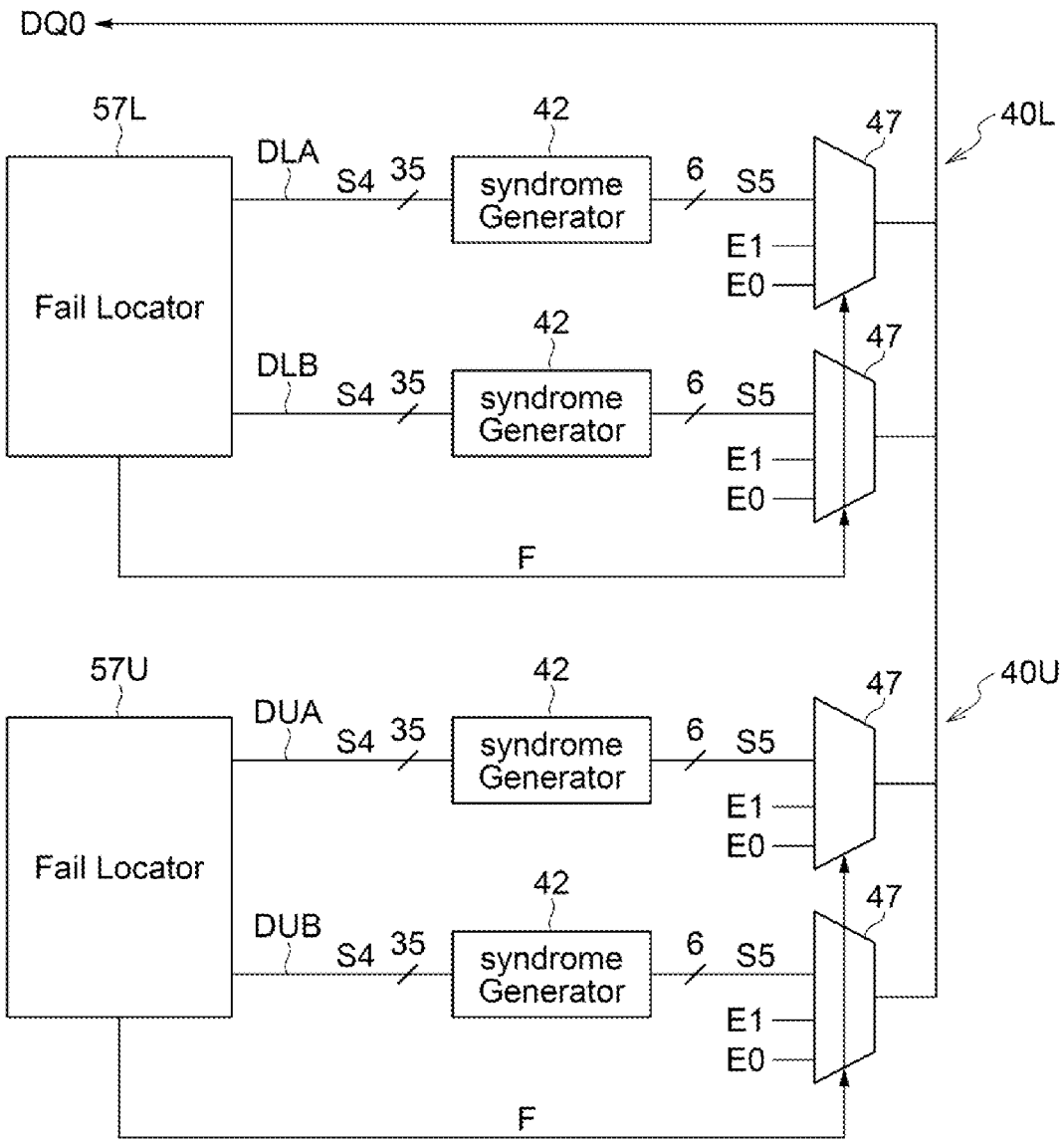

As shown in FIG. 8, a 35-bit fail data S4 transferred via the data I/O lines DLA and DLB is input to two syndrome generators 42 included in the GD buffer circuit 40L. Further, the 35-bit fail data S4 transferred via the data I/O lines DUA and DUB is input to the two syndrome generators 42 included in the GD buffer circuit 40U. Each syndrome generator 42 encodes the 35-bit fail data S4 to generate a 6-bit fail data S5. The fail data S5 is output in serial to outside via a multiplexer 47 from any of the data I/O terminals 51L (for example, DQ0). Further, in a case where three or more defective column planes are found in one memory bank 11, the fail locators 57L and 57U activate a fail signal F. When the fail signal F is activated, the multiplexers 47 select a signal E1. The signal E1 indicates that the defect cannot be remedied by a replacement operation on a column side. In this case, the defect is remedied by a replacement operation on a row side. Furthermore, in a case where there is no defective column plane, the multiplexer 47 selects a signal E0. The signal E0 indicates that there is no defective column plane.

Figure 9:
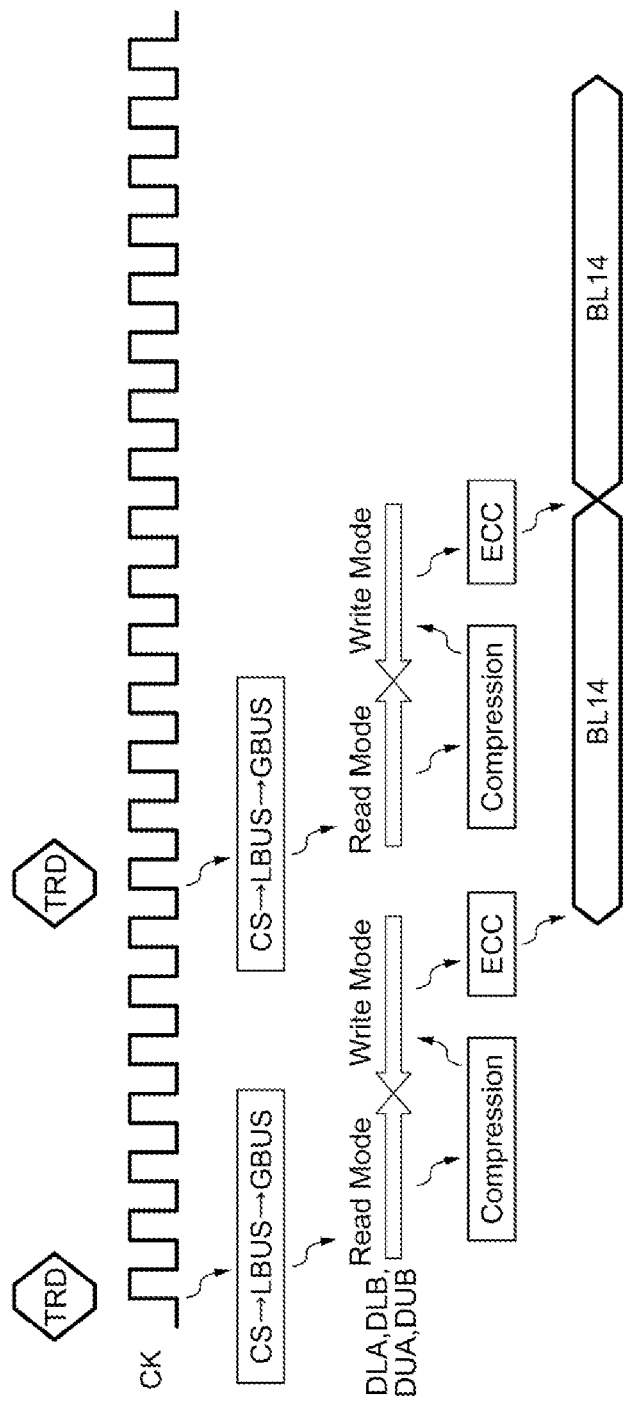
FIG. 9 is a timing chart for explaining flows of a test read data and a fail data in a test operation.

FIG. 9 is a timing chart for explaining flows of a test read data and a fail data in a test operation. As shown in FIG. 9, when a test read command TRD is issued from outside in synchronization with a clock signal CK, the memory cell array 10 performs a read operation, and a test read data is transferred to a global I/O line (GBUS) via a column switch (CS) and a local bus (LBUS). The test read data is transferred to the compression logic circuits 54L and 54U via the data I/O lines DLA, DUA, DLB, and DUB that are in a read mode. The compression logic circuits 54L and 54U compress the test read data to generate the fail data S4, and input the fail data S4 to the ECC circuits 31L and 31U via the data I/O lines DLA, DUA, DLB, and DUB that are in a write mode. The fail data S5 obtained by encoding in the ECC circuits 31L and 31U is output from a predetermined data I/O terminal in serial. In the example shown in FIG. 9, while seven bits obtained by adding one bit for distinguishing a memory bank from other memory banks to a 6-bit fail data is regarded as one unit, 14 bits composed of two units of data are output in serial.

As described above, in the semiconductor memory device according to one embodiment of the present disclosure, the fail data S4 generated by the compression logic circuits 54L and 54U is fed back to the GD buffer circuits 40L and 40U via the data I/O lines DLA, DUA, DLB, and DUB. Therefore, any dedicated bus for transferring the fail data S4 is not required. Further, since the fail data S4 is encoded by using the ECC circuits 31L and 31U included in the GD buffer circuits 40L and 40U, any dedicated circuit required for encoding the fail data S4 is not required.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
   a memory cell array;
   an I/O terminal supplied with an original write data in a normal operation;
   a compression logic circuit configured to generate a compressed test data in a test operation based on a test read data read from the memory cell array; and
   a syndrome generator configured to generate a first syndrome based on the original write data in the normal operation and generate a second syndrome based on the compressed test data in the test operation.

2. The apparatus of claim 1, wherein a corrected write data obtained by correcting the original write data by using the first syndrome is written in the memory cell array in the normal operation corresponding to a write operation.

3. The apparatus of claim 1, wherein the second syndrome is output from the I/O terminal in the test operation.

4. The apparatus of claim 2, further comprising a data bus, wherein the original write data is transferred from the I/O terminal to the syndrome generator via the data bus in the write operation.

5. The apparatus of claim 4, wherein the test read data is transferred from the memory cell array to the compression logic circuit via the data bus in the test operation.

6. The apparatus of claim 5, wherein the compressed test data is transferred from the compression logic circuit to the syndrome generator via the data bus in the test operation.

7. The apparatus of claim 6, wherein a read data read from the memory cell array is transferred from the memory cell array to the I/O terminal via the data bus in the normal operation corresponding to a read operation.

8. The apparatus of claim 6,
   wherein the data bus includes first and second data buses and wherein the original write data is transferred from the I/O terminal to the syndrome generator via selected one of the first and second data buses in the write operation.

9. The apparatus of claim 8, wherein the test read data is simultaneously transferred to the compression logic circuit via both the first and second data buses in the test operation.

10. The apparatus of claim 9, wherein the compressed test data is simultaneously transferred from the compression logic circuit to the syndrome generator via both the first and second data buses in the test operation.

11. An apparatus comprising:
a memory cell array;
a first circuit including a syndrome generator configured to generate a syndrome;
a second circuit including a compression logic circuit configured to generate a compressed test data;
a data bus coupled between the first and second circuits; and
a control circuit,
wherein, in a test operation, the control circuit is configured to:
control the first circuit to transfer a test read data read from the memory cell array to the second circuit via the data bus;
control the second circuit to generate the compressed test data by inputting the test read data to the compression logic circuit;
control the second circuit to transfer the compressed test data to the first circuit via the data bus; and
control the first circuit to generate the syndrome by inputting the compressed test data to the syndrome generator.

12. The apparatus of claim 11,
wherein the second circuit further includes a plurality of data I/O terminals, and
wherein the syndrome is output to outside via at least one of the plurality of data I/O terminals.

13. The apparatus of claim 12, wherein the syndrome is output to outside via one of the plurality of data I/O terminals in serial.

14. The apparatus of claim 12,
wherein the second circuit further includes a parity terminal, and
wherein, in a normal operation corresponding to a write operation, the control circuit is configured to:
control the second circuit to transfer a write data supplied to the plurality of data I/O terminals and a parity data supplied to the parity terminal to the first circuit via the data bus;
control the first circuit to generate the syndrome by inputting the write data and the parity data to the syndrome generator;
control the first circuit to correct the write data by using the syndrome; and
control the first circuit to write the corrected write data to the memory cell array.

15. The apparatus of claim 14, wherein, in the normal operation corresponding to a read operation, the control circuit is configured to:

control the first circuit to transfer a read data read from the memory cell array to the second circuit via the data bus; and
control the second circuit to output the read data to the plurality of data I/O terminals.

16. The apparatus of claim 15,
wherein the data bus includes first and second data buses, and
wherein selected one of the first and second data buses is used per issuance of a command in the read operation or the write operation.

17. The apparatus of claim 16, wherein both the first and second data buses are simultaneously used in the test operation.

18. An apparatus comprising:
a plurality of memory banks including first and second memory banks;
an I/O circuit including a compression logic circuit;
a buffer circuit coupled between the plurality of memory banks and the I/O circuit; and
first and second data buses coupled in parallel between the I/O circuit and the buffer circuit,
wherein, in a normal operation corresponding to a read operation, the buffer circuit is configured to transfer a read data read from the first memory bank to the I/O circuit by using selected one of the first and second data buses,
wherein, in the normal operation corresponding to a write operation,
the I/O circuit is configured to transfer a write data to the buffer circuit by using selected one of the first and second data buses, and
the buffer circuit is configured to transfer the write data to the first memory bank, and
wherein, in a test operation,
the buffer circuit is configured to transfer first and second test data read from the first and second memory banks, respectively, to the I/O circuit by using the first and second data buses, respectively,
the compression logic circuit is configured to generate first and second compressed test data based on the first and second test data, respectively, and
the I/O circuit is configured to transfer the first and second compressed test data to the buffer circuit by using the first and second data buses, respectively.

19. The apparatus of claim 18,
wherein the buffer circuit includes a syndrome generator, and
wherein the syndrome generator is configured to generate a first syndrome based on the write data in the write operation.

20. The apparatus of claim 19, wherein the syndrome generator is configured to generate a second syndrome based on the first and second compressed test data in the test operation.

* * * * *